United States Patent
Ho et al.

(10) Patent No.: US 7,748,912 B2
(45) Date of Patent: *Jul. 6, 2010

(54) DOUBLE MOLD OPTOCOUPLERS

(75) Inventors: Soo Kiang Ho, Singapore (SG); Chin Hian Sia, Singapore (SG); Thiam Slew Gary Tay, Singapore (SG); Meng Yong Shie, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 900 days.

This patent is subject to a terminal disclaimer.

(21) Appl. No.: 11/205,730

(22) Filed: Aug. 17, 2005

(65) Prior Publication Data

US 2005/0286840 A1    Dec. 29, 2005

Related U.S. Application Data

(63) Continuation-in-part of application No. 10/282,341, filed on Oct. 29, 2002, now Pat. No. 7,021,839.

(51) Int. Cl.
*G06B 6/00*    (2006.01)
(52) U.S. Cl. ........................................... 385/92
(58) Field of Classification Search ............... 385/92, 385/93, 53
See application file for complete search history.

(56) References Cited

U.S. PATENT DOCUMENTS

| | | | |
|---|---|---|---|
| 4,614,958 A | | 9/1986 | Mikami et al. |
| 5,056,922 A | | 10/1991 | Cielo et al. |
| 5,150,438 A | | 9/1992 | Brown |
| 5,296,715 A | | 3/1994 | Kronberg |
| 5,702,775 A | | 12/1997 | Anderson et al. |
| 5,751,009 A | * | 5/1998 | Anderson et al. ........... 250/551 |
| 6,031,251 A | | 2/2000 | Gempe et al. |
| 6,246,123 B1 | * | 6/2001 | Landers et al. .............. 257/787 |
| 6,306,688 B1 | * | 10/2001 | Lunceford .................. 438/127 |
| 6,525,386 B1 | | 2/2003 | Mills et al. |
| 6,754,407 B2 | * | 6/2004 | Chakravorty et al. .......... 385/14 |
| 7,021,839 B2 | * | 4/2006 | Ho ............................. 385/92 |

OTHER PUBLICATIONS

Vishay Telefunken, "Optocouplers", Website Retrieved from: www.vishay.com/products/optoelectronics/opc.html Retrieved on: Oct. 29, 2002, 1-3.

* cited by examiner

*Primary Examiner*—Daniel St.Cyr

(57) ABSTRACT

An optoelectronic device comprises a light source, a generally coplanarly disposed detector, the detector receiving light from the light source, a light conductive inner encapsulate molded around the light source and the detector, an opaque light reflective outer encapsulate molded around and interfaced with a surface of the light conductive inner encapsulate, and a lens disposed above, and in a light path between, the light source and the detector.

19 Claims, 3 Drawing Sheets

FIG. 3

DOUBLE MOLD OPTOCOUPLERS

CROSS-REFERENCE TO RELATED APPLICATIONS

This is a continuation-in-part of U.S. patent application Ser. No. 10/282,341, filed Oct. 29, 2002, entitled "LOW PROFILE OPTOCOUPLERS," now U.S. Pat. No. 7,021,839, the disclosure of which is incorporated herein by reference.

TECHNICAL FIELD

The present invention is generally related to optoelectronic devices and specifically to double mold optocouplers.

BACKGROUND OF THE INVENTION

Optocouplers are often used to provide galvanic isolation between different voltage sources in an electronic circuit. Functions of optocouplers include providing high voltage package isolation and isolating noise of a main signal from a resulting signal. In an electronic circuit, an optocoupler ensures electric isolation. For example, optocouplers are used in applications such as telecommunications equipment, programmable controllers, direct current (DC) to DC converters, switch-mode power supplies, alternating current (AC) to DC converters and battery chargers. Optocouplers are disclosed and discussed in Vishay Telefunken, "General Description Basic Function"; Vishay "Optoelectronics"; Mikami et al., U.S. Pat. No. 4,614,958; Brown, U.S. Pat. No. 5,150,438; and Gempe et al., U.S. Pat. No. 6,013,251, the disclosures of each of which are hereby incorporated herein by reference.

An optocoupler may be considered comparable to a transformer or relay in some cases. However, optocouplers are typically smaller, ensure considerably shorter switching times, eliminate contact bounce, eliminate interference caused by arcs, and do not experience mechanical wear. Thus, optocouplers are particularly well suited for circuits used in microelectronics and also in data processing and telecommunication systems. Optocouplers are also used to promote component safety, such as in switch-mode power supplies.

In practice, a control circuit or the like is typically located on one side of the optocoupler, for example the emitter side, while a load circuit is located on the other side, the detector side in this example. The circuits are electrically isolated from each other by the optocoupler. Signals from the control circuit are transmitted optically to the load circuit, and are therefore free of reciprocal effects.

In most cases, optical transmission by an optocoupler employs light beams with wavelengths spanning from the red to infrared range. The bandwidth of signals transmitted by an optocoupler typically range from a DC voltage signal to frequencies in the MHz band, although signal frequencies in the GHz range are possible.

FIG. 1 shows an optocoupler configuration representative of the majority of optocoupler packages found today. As shown in FIG. 1 optocoupler package 100 defines light emitting device or diode (LED) 102 directly above detector 104 separated by generally transparent insulating material 109. Also shown in FIG. 1 for completeness are lead 103 coupled to LED 102 and lead 106 coupled to detector 104 by bond wire 105. Leads 103 and 106 provide signal communication between components of optocoupler package 100 and those external thereto.

In the above conventional configurations, the package height is limited by at least the sum of the device heights (height of LED 102 plus the height of detector 104), with additional material such as transparent insulating material 109 and mold compound 107 required to complete the package adding to the package height. However, as today's electronic applications become more and more complex and integrated, there is a continuing need to reduce component package size and capacity without sacrificing functionality. This becomes more challenging with the emergence of notebook computers, personal digital assistants (PDA), cellular telephones, and the like.

FIG. 2 shows an optocoupler package configuration representative of those described in U.S. Pat. Nos. 5,150,438 and 6,031,251, referenced above. Specifically, shown in FIG. 2 is an in-line or coplanar arrangement for a wide body optocoupler package 200, providing a reduced optocoupler profile or height (although this configuration may have a larger substrate footprint than optocoupler package 100). Such coplanar optocoupler packages typically employs a transparent insulation material 209, such as silicone, surrounding LED 202 and detector 204. Further, a reflective material 211, such as a white coating may coat transparent material 209. Mold compound 207 encapsulates the components of optocoupler package 200. Also shown in FIG. 2 are lead 203 coupled to LED 202 and lead 206 coupled to detector 204 by bond wire 205. Leads 203 and 206 provide signal communication between components of optocoupler package 200 and those external thereto, such as devices disposed upon printed circuit board 201.

Typical processes of creating both the clear insulation 209 and reflective layer 211 are cumbersome, slow and expensive, as the entire clear silicone insulate must be enclosed to restrict the LED light from escaping into mold compound 207. The shape of the optocoupler's profile, especially the clear silicone insulate, is crucial to performance, as this affects the light coupling efficiency of the optocoupler. However, typical methods of dispensing or depositing the silicone do not produce an accurate reproducible shape. With this process limitation, limits the number of optocouplers that may be integrated within a package, rendering the production of multichannel optocouplers problematic. Additionally, in the above linear configurations, indirect or reflective light coupling also results in inefficiencies in the reflection of the light.

Prior attempts to address these issues have had unsatisfactory results. For example, prior attempts have be made to increase the output of a white coating by increasing a matrix design of the leadframe. Other prior attempts to maximize output have called for use of a spray painting processes to apply the white reflective layer. While these methods have, to some degree, improve the output of devices and reduced cost, other problems have resulted. For example, a complicated leadframe matrix results in a inconsistent disposition of the reflective coating and a spray paint process often produces inconsistent coverage, which degrades the high voltage performance of an optocoupler.

SUMMARY

An embodiment of an optoelectronic device comprises a light source, a generally coplanarly disposed detector, the detector receiving light from the light source, a light conductive inner encapsulate molded around the light source and the detector, an opaque light reflective outer encapsulate molded around and interfaced with a surface of the light conductive inner encapsulate, and a lens disposed above, and in a light path between, the light source and the detector.

An embodiment of a multichannel optocoupler comprises a plurality of light emitters, a plurality of photodetectors, each of the photodetectors disposed generally coplanarly with a corresponding one of the light emitters providing an emitter and photodetector set, each of the photodetectors receiving light from the corresponding one of the light emitters, a light conductive inner encapsulate molded to encapsulate the light emitters and the photodetectors, and an opaque light reflective outer encapsulate molded to encapsulate the light conductive encapsulate and to interface with a surface of the light conductive, the outer encapsulate and inner encapsulate defining a plurality of walls, each of the walls disposed between each emitter and photodetector set.

An embodiment of a method for providing double molded optocouplers comprises molding a transparent inner encapsulate about at least one emitter and at least one generally coplanar photodetector, curing the inner encapsulate, and molding an opaque reflective outer encapsulate over the inner encapsulate.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION

The present systems and methods provide an optical device such as and optocoupler in which a clear epoxy or silicone encapsulate surrounding the LED and photodetector integrated circuit (IC) is molded or cast, rather than dispensed or deposited as is typical in the art. Casting or molding can profile the shape of the clear insulate dome more accurately, in a repeatable manner. Additionally, a lens may be fashioned or formed in the transparent encapsulate immediately above the LED and photodetector IC to maximize light coupling efficiency. The encapsulated components may in turn be encapsulated, such as with an opaque epoxy. The final encapsulation epoxy can be of a reflective color, such as white, to reflect stray light from leaving the clear inner encapsulate. Embodiments of the present systems and methods result in improved light coupling between the LED and photodetector IC. As a result, not only may lower cost dimmer LEDs be used in the present optocouplers, but production yield loss due to insufficient light coupling in finished optocouplers may be decreased. Embodiments of the present optocouplers may include multi-channel optocouplers, in which the inner encapsulate is molded or cast to create "walls" between LED/detector pairs to provide separate signal channels.

Figure 1:
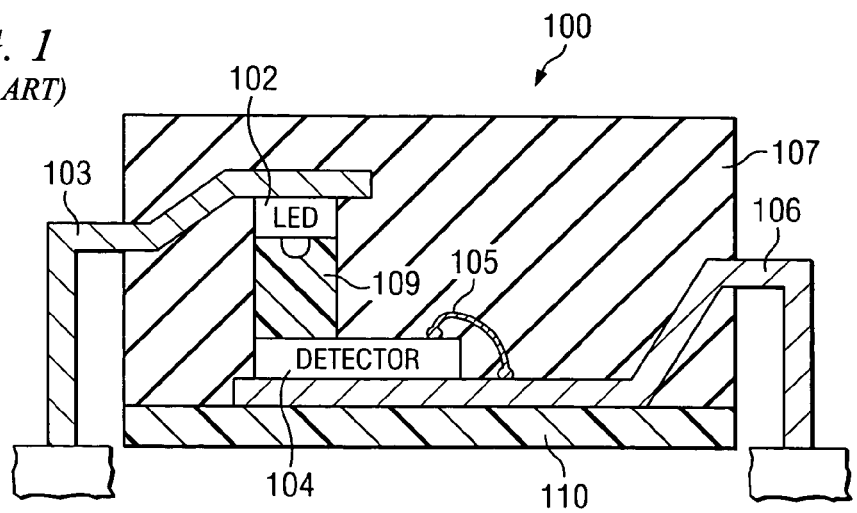
FIG. 1 is a partially fragmented side view of a prior art optocoupler.
Figure 2:
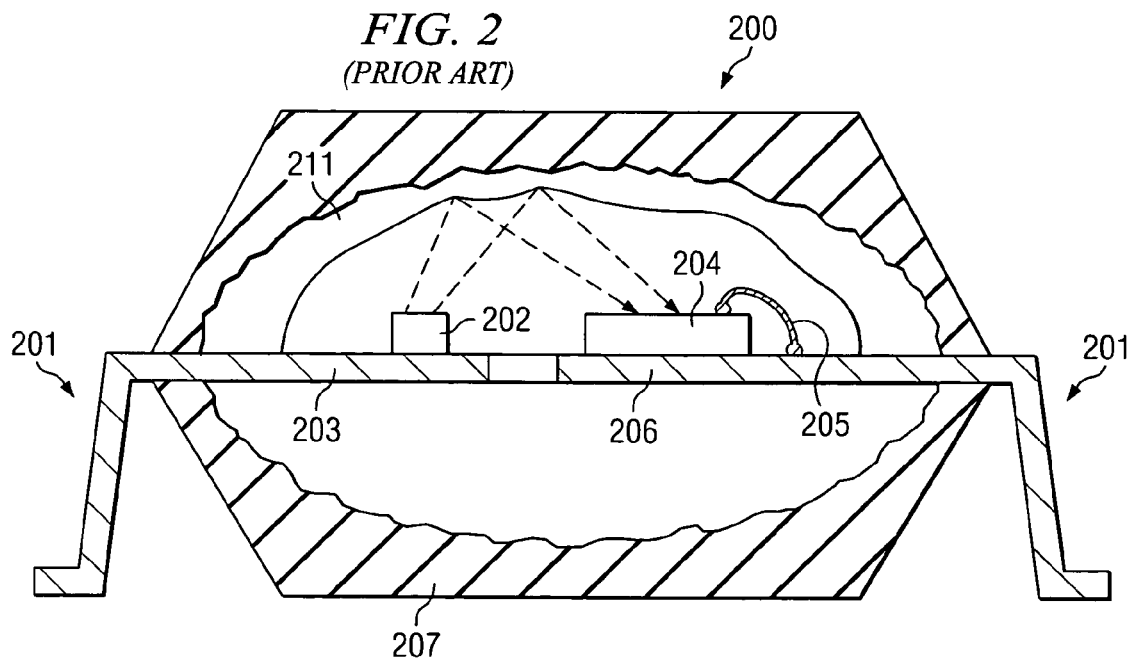
FIG. 2 is a partially fragmented side view of a prior art linear optocoupler.
Figure 3:
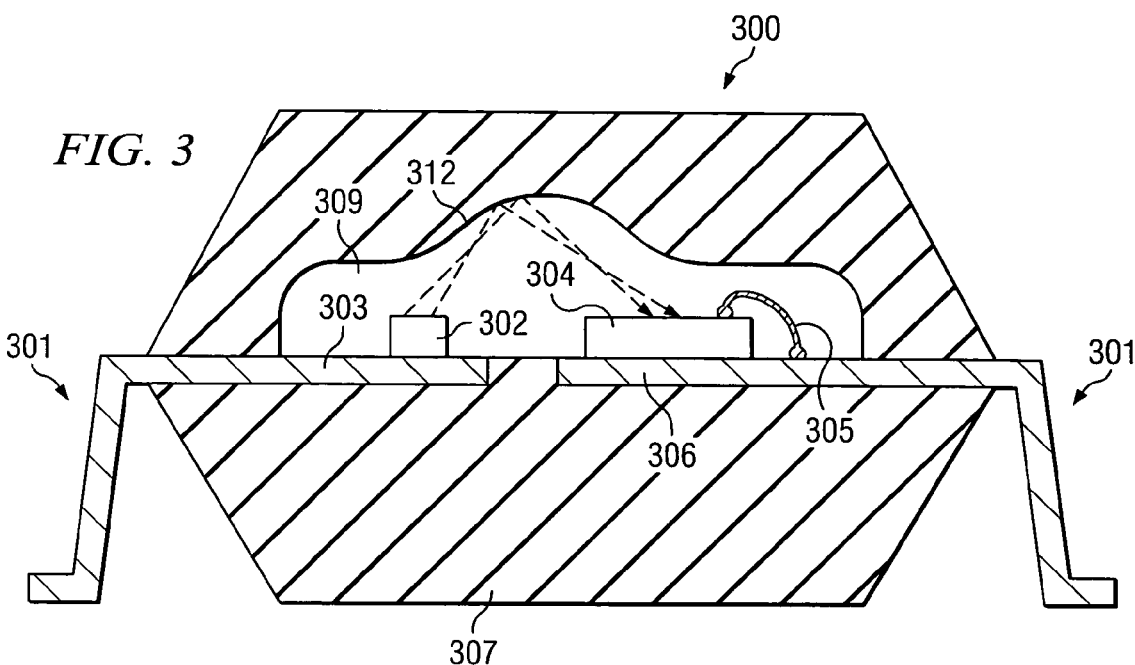
FIG. 3 is a partially fragmented side view of an embodiment of a double mold optocoupler in accordance with the present systems and methods.

Turning to FIG. 3 an embodiment of present inventive optocoupler 300 is shown. Emitter 302, such as may comprise any suitable light source including a LED, LASER, and the like, and detector 304, such as may comprise any suitable photoelectric receiver including a photo diode, photo transistor, and the like, are positioned coplanar on leadframe 301, or the like. This coplanar or linear configuration provides a degree of reduction of the package profile or height of optocoupler 300 over that of the conventional optocoupler of FIG. 1, such as disclosed in U.S. patent application Ser. No. 10/282,341. In the embodiment of FIG. 3, leads 303 and 306 extend from emitter 302 and detector 304, respectively. Bond wire 305 may couple detector 304 to lead 306. Of course, other lead configurations may be utilized according to the present systems and methods. Although a coplanar configuration is shown herein, it shall be appreciated that coplanar configurations of the present systems and methods are intended to encompass a generally coplanar configuration wherein the emitter and detector are somewhat out of the same plane in the profile, such as where one of emitter 302 and detector 304 are disposed directly upon a substrate, printed circuit board (PCB), or the like, and the other one of emitter 302 and detector 304 are disposed upon a corresponding one of leads 303 and 306.

According to the illustrated embodiment, double encapsulation is used to trap the light emissions from emitter 302 within light conductive or transparent inner encapsulate 309. Specifically, inner encapsulate 309 is preferably molded around emitter 302 and detector 304 in a predetermined, repeatable shape. Outer opaque encapsulate 307 is preferably molded around inner transparent encapsulate 309. Outer opaque encapsulate 307 is also preferably a reflective color, such as white.

Generally, inner encapsulate 309 may comprise an epoxy resin or silicone compound that has good optical properties, such as high Transmittance. However, embodiments of the present systems and methods may utilize any suitable inner encapsulate material, such as plastics, glass, various resin compounds, and the like, providing sufficient light transmittance.

The resin comprising outer encapsulate 307 is preferably comprised of an opaque lightproof resin, or the like to thereby provide protection with respect to light noise as well as physical protection of the various components of optocoupler 300. Additionally, outer encapsulate 307 is also preferably a color which will provide reflectance within clear inner encapsulate 309. For example, outer encapsulate 307 may comprise an epoxy resin having an opacifier therein which will render the outer encapsulate white. Of course, other materials moldable may be utilized in providing outer encapsulate 307, such as plastics, metals, various resin compounds, and the like, and other colors that sufficiently reflect the light of emitter 302.

In order to optimize the coupling of light between a emitter 302 and detector 304 within an optocoupler package of the present systems and methods, lens 312 may be used. For example, an ellipsoidal optical lens may be cast into the top surface of the inner encapsulate 309, such as to provide a concave lens surface facing the emitter and/or detector of the optocoupler. Optical lens 312 may be configured to maximize the reflected incidence of light and reduce the angle of incidence light (as shown by dashed lines in FIG. 3), achieving greater efficiencies with respect to the coupling of light between emitter and detector, and/or facilitating a lower package profile for optocoupler 300.

In embodiments employing lenses, lens 312 may be defined in inner encapsulate 309 using molding or casting techniques when encapsulating emitter 302 and detector 304 in inner encapsulate 309. Additionally or alternatively, lens 312 may be formed using post-forming techniques, such as grinding, milling, polishing, et cetera, with respect to inner encapsulate 309. Lens 312 is preferably sized and positioned to be placed in juxtaposition with the top of emitter 302 and detector 304. Use of different ICs and different emitter/detectors in different optocoupler products may result in different lens positions and/or configurations. In short, the lens position may be dependent upon the optical characteristics of the emitter and/or the detector.

Lens 312 preferably has an ellipsoidal shape that may be determined through computer simulation studies for different optocoupler applications and emitter/detector parings or through empirical study. However, other lens shapes and configurations may be utilized, such as circular, cylindrical, anamorphic, aspheric, Fresnel, hemispheric, parabolic, spiral, et cetera, as well as combinations of any of the foregoing. According to embodiments of the present systems and methods employing an ellipsoidal lens, emitter 302 and detector 304 are preferably positioned on ellipse centers of lens 312 so as to make use of the particular angles of lens 312 to transmit more light to detector 304 and, thereby, improve the light coupling efficiency of optocoupler 300. In such an embodiment, emitter 302 and photo diode 304 are preferably positioned at equal distance from an absolute center of lens 312.

Figure 4:
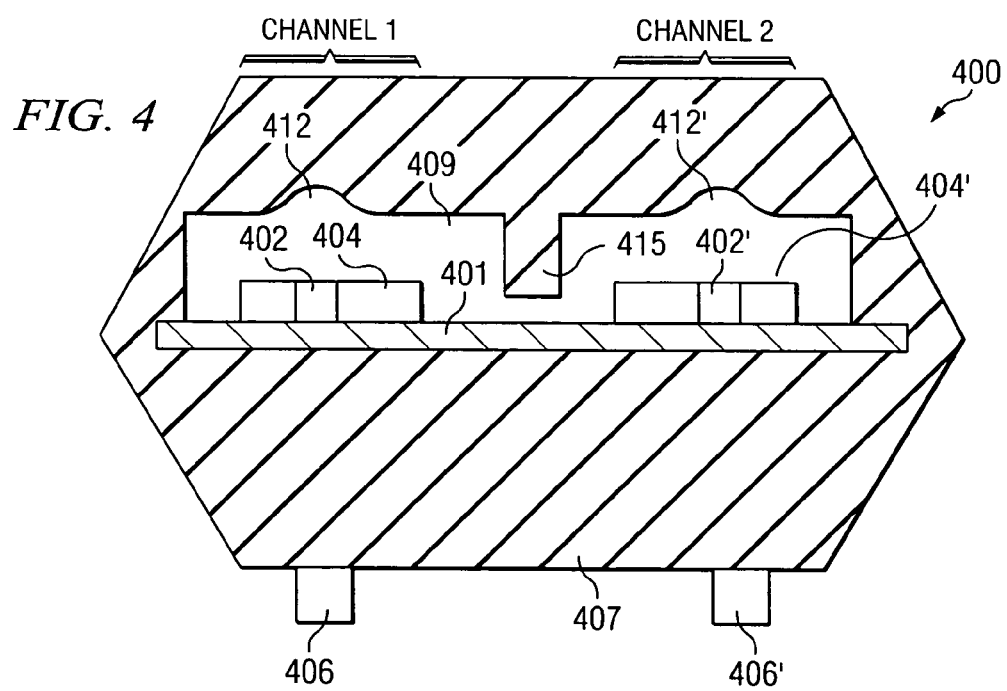
FIG. 4 is a partially fragmented end view of the an embodiment of a double mold multichannel optocoupler in accordance with the present systems and methods.

As best illustrated in FIG. 4, embodiments of the present optocouplers may include multi-channel optocouplers 400. Optocoupler 400 may have a similar side view appearance in cross section as optocoupler 300 of FIG. 3. As with optocoupler 300, multichannel optocoupler 400 includes a molded inner encapsulate (409), in turn encapsulated by an opaque, preferably reflective, molded outer encapsulate (407). Each channel includes a light source emitter 402 or 402', such as may comprise any suitable light source including a LED, LASER, and the like, and detector 404 or 404', such as may comprise any suitable photoelectric receiver including a photo diode, photo transistor, and the like, are positioned coplanar on leadframe 401, or the like. This coplanar or linear configuration may provide a relatively low profile multichannel optocoupler. In the embodiment of FIG. 4, leads 406 and 406' can be seen extending from detectors 404 and 404', respectively. Leads from emitters 402 and 402' cannot be seen in FIG. 400 due to the fragmentation of the FIGURE and bond wires extending from detectors 404 and 404' to leads 406 and 406', respectively, have been omitted for clarity. Again, other lead configurations and/or generally coplanar configuration may be utilized according to the present systems and methods, as discussed above in relation to FIG. 3. Although, FIG. 4 illustrates a 2-channel optocoupler, multichannel optocouplers having any number of channels are anticipated by the present systems and methods.

As described in greater detail in discussing FIG. 3, lenses 412 and 412' may be used to optimize the coupling of light between corresponding emitter 402 and detector 404, and/or emitter 402' and detector 404'. For example, ellipsoidal optical lenses 412 and 412' may be cast into the top surface of the inner encapsulate 409, such as to provide concave lens surfaces facing the respective emitter and detector set of the multichannel optocoupler. As noted above lens 412 and 412' may be defined in inner encapsulate 409 using mold casting techniques when encapsulating emitters 402, 402' and detectors 404, 404' in inner encapsulate 409. Additionally or alternatively, lens 412 and 412' may be formed using post-forming techniques, such as grinding, milling, polishing, et cetera, with respect to inner encapsulate 409. Lenses 412 and 412' each preferably have an ellipsoidal shape. However, other lens shapes and configurations may be utilized, such as circular, cylindrical, anamorphic, aspheric, Fresnel, hemispheric, parabolic, spiral, et cetera, as well as combinations of any of the foregoing. For an ellipsoidal lens, the corresponding emitter and detector set are preferably positioned on ellipse centers of the corresponding lens so as to make use of the particular angles of the corresponding lens to focus and transmit more light to the corresponding detector and, thereby, improve the light coupling efficiency of that channel of the optocoupler and to possibly reduce light scatter to neighboring channels of the multichannel optocoupler.

In multichannel optocoupler embodiment 400 of FIG. 4, wall 415 is used to isolate channels one and two. A wall may be disposed between each channel emitter and detector set of a multichannel optocoupler. Wall 415 may be formed by molding a "reverse" shape for the walls into inner encapsulate 409, which will be filed when inner encapsulate is encapsulated by outer encapsulate 407. As the outer encapsulate is preferably a reflective, opaque material, wall 415 blocks light from one channel from affecting operation of a neighboring channel. As noted above, focusing of reflected light by lenses 412 and 412' may enhance the isolation provided by wall(s) 415. Isolation may be further enhanced by the shape of the walls. For example, the wall length and/or thickness may be selected such that the shadow cast by the wall will further enhance the desired isolation.

Light propagating through an optical medium can be contained within the medium by a phenomenon known as total internal reflection (TIR). When light travels from a denser medium into a less dense medium, it will be reflected back into the denser medium if the angle of incidence is less than a certain critical angle. The critical angle can be defined as the angle below which light inside the denser medium should strike the boundary in order to be reflected back into the medium rather than be transmitted through the boundary and out of the medium.

According to embodiments of the present systems and methods a medium outside of the optical medium of the inner encapsulate 309 or 409, in which an emitter and detector of an optocoupler are disposed, may be employed that has a lower index of reflection than the inner encapsulate medium. For example an air gap may be defined between inner encapsulate 309 (or 409) and outer encapsulate 307 (or 407). Thus, according to the TIR phenomenon, light inside the inner capsulate that strikes the boundary at an angle smaller than the critical angle does not pass through the boundary and is reflected back into the inner encapsulate. It should be appreciated that, in this embodiment, the angle of incidence is affected by the height of the inner encapsulate. Therefore, the height of the inner encapsulate, and correspondingly the profile of the package configuration, may be established at least in part as a function of the critical angle. Synergistically, as the packaging profile is shortened, the angle of incidence becomes more acute (less than the critical angle) as desired for implementation of the TIR phenomenon. Also, mediums of various densities and other attributes may be utilized in achieving the TIR phenomenon according to the present systems and methods. For example, a medium of lesser density than air, such as helium or nitrogen, may be utilized in selecting a desired critical angle and/or to accommodate the use of an inner encapsulate medium having a density providing a reflective index of 1.0 or less. Additionally or alternatively, the critical angle, and thus an achievable package profile, may be selected or adjusted through manipulation of the media density differences (e.g. utilizing a more dense optical media and/or utilizing a less dense medium outside the optical medium). Accordingly, optical medium height, optical medium density, and density of the medium outside of the optical medium may all be selected to provide desired optocoupler package attributes.

Figure 5:
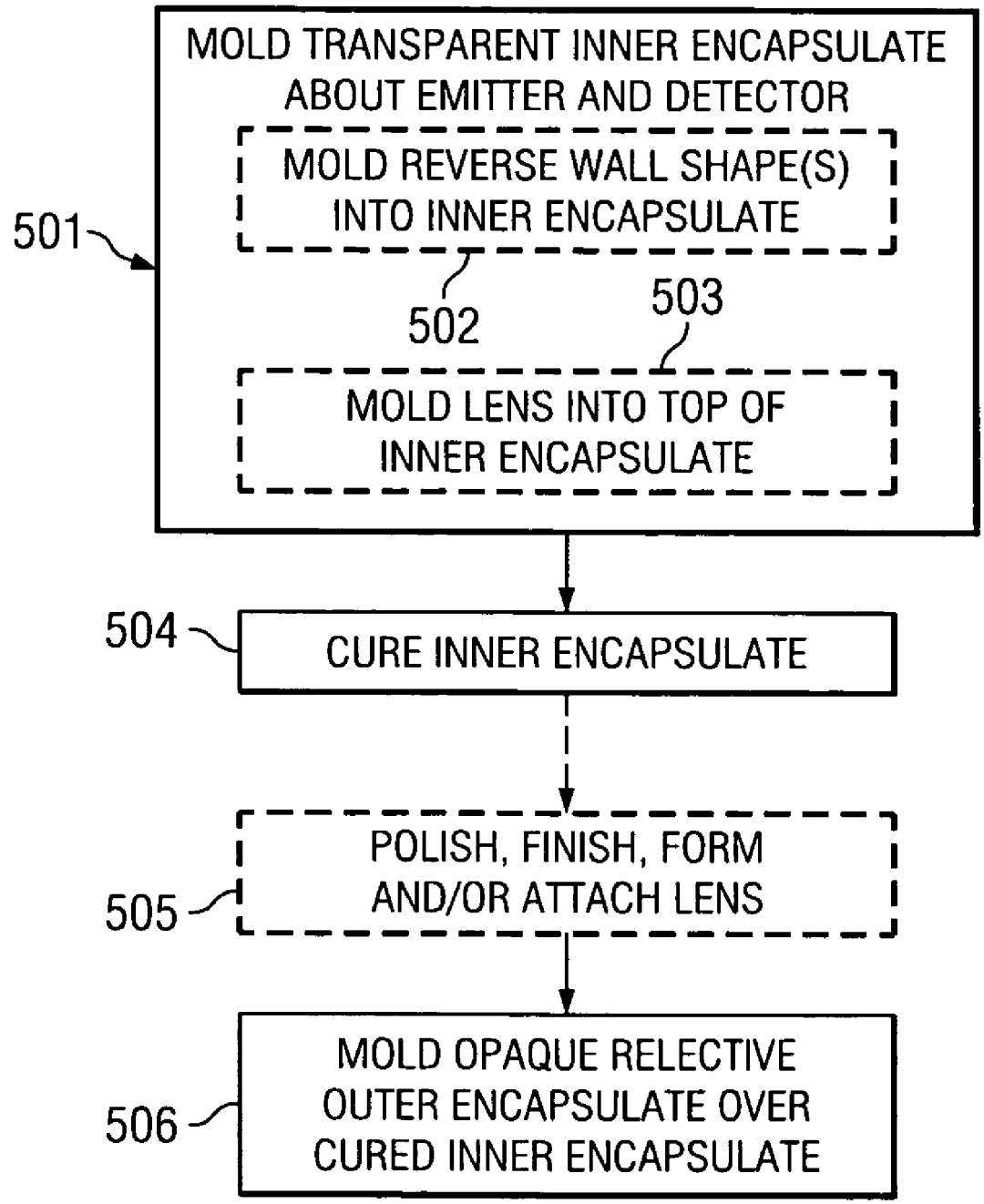
FIG. 5 is a flow chart of an embodiment of a method for forming a double mold optocoupler in accordance with the present systems and methods.

As flow charted in FIG. 5, in accordance with the present systems and methods the present optocoupler is formed using molding processes. At 501 a transparent inner encapsulate is molded about at least one emitter and at least one generally coplanar detector. In a multichannel optocoupler, such as shown in FIG. 4 a plurality of emitter and detector sets or pairs are encapsulated at 502 and a reverse shape for a wall is molded into the inner encapsulate between each of the emitter and detector sets at 502. The mold used to form the inner encapsulate at 501 might also form a lens into the upper surface of the inner encapsulate above the emitter and the detector (above each of the emitter and detector sets in a multichannel optocoupler) at 503. At 504 the inner encapsulate is cured and a lens may be formed into, or attached to, the inner encapsulate if not molded into the inner encapsulate at 501. Alternatively, a lens formed into the inner encapsulate at 501 may be polished or otherwise finished after curing at 505. At 506 an opaque, reflective outer encapsulate is molded over the inner encapsulate. In the case of a multichannel optocoupler the outer encapsulate material fills the reverse wall shapes of the inner encapsulate during molding at 506, forming walls, such as wall 415 of FIG. 4. As a result, in the optocoupler formed light emitted from a light source is reflected by the reflective outer encapsulate to the corresponding detector.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. An optoelectronic device comprising:
a light source;
a generally coplanarly disposed detector, said detector receiving light from said light source;
a light conductive inner encapsulate molded around said light source and said detector;
an opaque light reflective outer encapsulate molded around and interfaced with a surface of said light conductive inner encapsulate;
a lens disposed above, and in a light path between, said light source and said detector;
wherein said lens is defined in said light conductive inner encapsulate; and
wherein said lens is molded into said light conductive inner encapsulate.

2. The device of claim 1 wherein said lens is generally centered between said light source and said detector to focus said light from said light source on said detector.

3. The device of claim 1 wherein said lens presents a concave surface in a direction of said light source and said detector.

4. The device of claim 1 wherein said lens is ellipsoidal extending, at least in part, from over said light source to over, at least in part, said detector.

5. A multichannel optocoupler comprising:
a plurality of light emitters;
a plurality of photodetectors, each of said photodetectors disposed generally coplanarly with a corresponding one of said light emitters providing an emitter and photodetector set, each of said photodetectors receiving light from said corresponding one of said light emitters;
a light conductive inner encapsulate molded to encapsulate said light emitters and said photodetectors; and
an opaque light reflective outer encapsulate molded to encapsulate said light conductive encapsulate and to interface with a surface of said light conductive, said outer encapsulate and inner encapsulate defining a plurality of walls, each of said walls disposed between each emitter and photodetector set.

6. The optocoupler of claim 5 further comprising a lens disposed above, and in a light path between said light emitter and said photodetector of each of said emitter and photodetector sets.

7. The optocoupler of claim 6 wherein said each lens is defined in said light conductive inner encapsulate.

8. The optocoupler of claim 6 wherein each lens is molded into said light conductive inner encapsulate.

9. The optocoupler of claim 6 wherein each lens is generally centered between a light emitter and corresponding photodetector of an emitter and photodetector set to focus said light from said light emitter of said emitter and photodetector set on said corresponding photodetector of said of said emitter and photodetector set.

10. The optocoupler of claim 6 wherein each lens presents a concave surface in a direction of a light emitter and corresponding photodetector of an emitter and photodetector set.

11. The optocoupler of claim 6 wherein each lens is ellipsoidal and extends, at least in part, from over a light emitter to over, at least in part, a corresponding photodetector of an emitter and photodetector set.

12. A method comprising:
molding a transparent inner encapsulate about at least one light emitter and at least one generally coplanar photodetector;
curing said inner encapsulate;

molding an opaque reflective outer encapsulate over said inner encapsulate;

disposing a lens above said light emitter and said photodetector, said lens focusing said light from said light emitter on said photodetector; and wherein said disposing a lens comprises molding said lens into said inner encapsulate during said molding of said transparent inner encapsulate.

13. The method of claim 12 wherein said disposing a lens further comprises generally centering said lens between said light emitter and said photodetector to focus said light from said light emitter on said photodetector.

14. The method of claim 12 wherein said disposing a lens comprises presenting a concave surface of said lens in a direction of said light emitter and said photodetector.

15. The method of claim 12 wherein said lens is ellipsoidal extending, at least in part, from over said light emitter to over, at least in part, said photodetector.

16. The method of claim 12 wherein said at least one emitter and at least one generally coplanar photodetector comprises a plurality of emitter and photodetector sets, and the method further comprises:

defining a wall between each said emitter and photodetector sets.

17. The method of claim 16 wherein said wall comprises a portion of said opaque light reflective outer encapsulate molded to extend between adjacent emitter and photodetector sets.

18. The method of claim 17 wherein said portion of said opaque light reflective outer encapsulate extends into a space molded into said transparent inner encapsulate to define said wall.

19. The method of claim 12 wherein said at least one emitter and at least one generally coplanar photodetector comprises a plurality of emitter and photodetector sets, said molding a transparent inner encapsulate further comprises defining a reverse wall shaped space in said transparent inner encapsulate between each of said emitter and photodetector sets, and said molding an opaque reflective outer encapsulate over said inner encapsulate results in an opaque reflective wall being disposed between each of said emitter and photodetector sets.

* * * * *